United States Patent [19]
Pfiester et al.

[11] Patent Number: 5,371,035
[45] Date of Patent: Dec. 6, 1994

[54] METHOD FOR FORMING ELECTRICAL ISOLATION IN AN INTEGRATED CIRCUIT DEVICE

[75] Inventors: James R. Pfiester; Philip J. Tobin, both of Austin, Tex.

[73] Assignee: Motorola Inc., Schaumburg, Ill.

[21] Appl. No.: 11,621

[22] Filed: Feb. 1, 1993

[51] Int. Cl.$^5$ .......................................... H01L 21/302
[52] U.S. Cl. ........................................................ 437/69
[58] Field of Search ................................ 437/69, 62; 148/DIG. 85, DIG. 86

[56] References Cited

U.S. PATENT DOCUMENTS

| | | | |
|---|---|---|---|
| 4,561,172 | 12/1985 | Slawinski et al. | 437/DIG. 85 |
| 4,927,780 | 5/1990 | Roth et al. | 437/69 |
| 5,093,277 | 3/1992 | Hideaki et al. | 437/69 |
| 5,175,123 | 12/1992 | Vasquez et al. | 437/69 |
| 5,192,707 | 3/1993 | Hodges et al. | 437/69 |
| 5,196,437 | 3/1993 | Lu et al. | |
| 5,215,935 | 6/1993 | Nagao | 437/69 |
| 5,260,229 | 11/1993 | Hodges et al. | 437/69 |

FOREIGN PATENT DOCUMENTS

| | | | |
|---|---|---|---|
| 166988 | 1/1979 | Japan | 437/69 |
| 59-76472 | 5/1984 | Japan | 437/69 |
| 2132830 | 5/1990 | Japan | 437/69 |
| 2268434 | 11/1990 | Japan | 437/69 |
| 5-74764 | 3/1993 | Japan | 437/69 |

OTHER PUBLICATIONS

King et al., "PMOS Transistors in LPCVD Polycrystalline Silicon–Germanium Films", IEEE Electron Device Letters, vol. 12, No. 11, Nov. 1991, pp. 584–586.

Godbey et al., "Selective Removal of Si1-xGex from (100) Si using HNO3 and HF", Journal of the Electrochemical Society, vol. 139, No. 10, Oct. 1992, pp. 2943–2947.

Chang et al., "Selective Etching of SiGe on SiGe/Si Heterostructures", Journal of the Electrochemical Society, vol. 138, No. 1, Jan. 1991, pp. 202–204.

Roth et al., "Polysilicon Encapsulated Local Oxidation", IEEE Electron Device Letters, vol. 12, No. 3, Mar. 1991, pp. 92–94.

Koyama et al., "Etching characteristics of Si1-xGex alloy in ammoniac wet cleaning", Applied Physics Letters, vol. 57, No. 21, Nov. 1990, pp. 2202–2204.

Primary Examiner—Olik Chaudhuri
Assistant Examiner—S. Mulpuri
Attorney, Agent, or Firm—Kent J. Cooper

[57] ABSTRACT

A layer of silicon-germanium (57) allows electrical isolation structures, having reduced field oxide encroachment, to be formed without adversely effecting the adjacent active regions (64). A high etch selectivity between silicon-germanium and the silicon substrate (52) allows the silicon-germanium layer (57) to be removed, after field oxidation, without damaging the underlying active regions (64).

8 Claims, 3 Drawing Sheets

METHOD FOR FORMING ELECTRICAL ISOLATION IN AN INTEGRATED CIRCUIT DEVICE

FIELD OF THE INVENTION

This invention relates generally to semiconductor devices, and more specifically to a process for the formation of electrical isolation structures in a semiconductor integrated circuit.

BACKGROUND OF THE INVENTION

Local oxidation of silicon (LOCOS) is the most commonly used isolation technology for silicon integrated circuits. Unfortunately, LOCOS has an inherently large field oxide encroachment that precludes it from being used in advanced integrated circuits requiring high device packing densities. In a standard LOCOS process a thin layer of pad oxide is thermally grown on the surface of a silicon wafer. A silicon nitride layer is then deposited onto the pad oxide layer. The silicon nitride layer is then photolithographically patterned and etched to define active regions and isolation regions. Field oxide is then grown in the isolation regions while the active regions, which are masked by the patterned silicon nitride layer, are protected from the oxidation process. After field oxide growth, however, the area of the resulting active region is smaller than the actual intended area, as defined by the patterned silicon nitride layer. This occurs because oxygen laterally diffuses through the pad oxide layer, underneath the patterned silicon nitride mask, and reacts with the underlying silicon surface. Therefore, field oxide is formed not only in the isolation regions, but it also encroaches into the adjacent active regions. As a result, scaling of active area dimensions is limited and therefore integrated circuits with high device packing densities cannot be achieved with standard LOCOS isolation.

In order to reduce field oxide encroachment, several LOCOS-like isolation techniques have been proposed. In one approach the pad oxide thickness is reduced and a layer of polysilicon is inserted between the pad oxide and the overlying silicon nitride. The polysilicon absorbs stress from the silicon nitride, thus allowing the silicon nitride film thickness to be increased and the pad oxide thickness to be reduced in order to minimize field oxide encroachment. Additionally, during field oxidation the exposed edge portions of the polysilicon layer become oxidized, thus consuming some of the oxidant species that would otherwise oxidize the substrate. After field oxidation the silicon nitride and polysilicon stack are then removed using wet or dry etching techniques. Unfortunately, the etch selectivity achieved between single crystal silicon and polysilicon is approximately 1 to 1 with these etching techniques. Therefore, during the polysilicon removal process if there are pinholes or defects present in the underlying pad oxide layer, then the underlying silicon substrate in the active region will be etched. The resulting damage adversely affects the functionality and reliability of semiconductor devices subsequently fabricated on these active regions. Furthermore, with this technique further reductions in field oxide encroachment, through increased thinning of the pad oxide layer, are limited due to the aforementioned problems associated with pinholes or defects.

In a second approach, the pad oxide layer lying underneath the silicon nitride oxidation mask is undercut to form a cavity. The cavity is then filled using a conformal layer of polysilicon. During field oxidation, the polysilicon filled cavity acts as a sacrificial layer by consuming oxidant species, and thus it inhibits the transportation of oxygen to the silicon surface underlying the edge of the silicon nitride oxidation mask. Unfortunately, after field oxidation unoxidized polysilicon may be left in the cavity region, which must be subsequently removed. Similarly, removal of the unoxidized polysilicon can result in the underlying active region being damaged, as discussed above. Accordingly, a need exists for an isolation process that reduces field oxide encroachment, but at the same time does not adversely effect the active regions.

SUMMARY OF THE INVENTION

The previously mentioned problems with existing isolation processes are overcome by the present invention. In one embodiment of the invention, electrical isolation in an integrated circuit device is formed by providing a semiconductor substrate. A buffer layer is formed overlying the substrate. A silicon-germanium layer is formed overlying the buffer layer. An oxidation resistant layer is formed overlying the silicon-germanium layer. The oxidation resistant layer is patterned to define an isolation region of the substrate and to leave a remaining portion of the oxidation resistant layer overlying the substrate. The isolation region of the substrate is oxidized to form electrical isolation in the isolation region of the substrate. The remaining portion of the oxidation resistant layer is then removed. The substrate is then exposed to a siliconogermanium etchant. Other aspects of this invention involve other methods for making electrical isolation in an integrated circuit.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
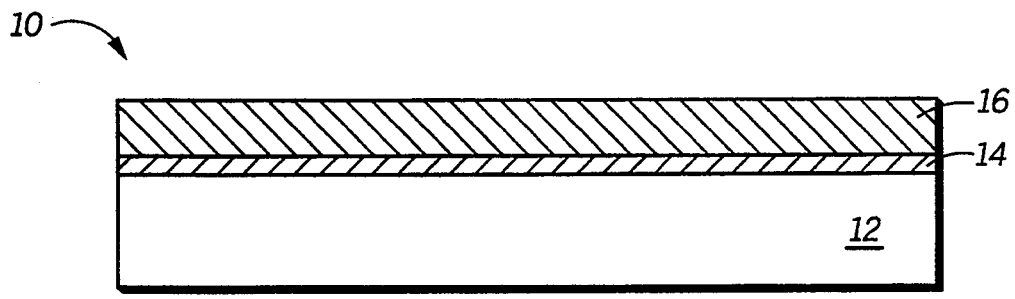
FIGS. 1–8 illustrate, in cross-section, process steps in accordance with one embodiment of the invention.

FIGS. 1 through 7 illustrate, in cross-section, process steps in accordance with one embodiment of the invention wherein electrical isolation structures are formed in an integrated circuit. Shown in FIG. 1 is a portion 10 of an integrated circuit structure comprising a semiconductor substrate 12, a first buffer layer 14, and an oxidation resistant layer 16. Substrate 12 is preferably monocrystalline silicon. Alternatively substrate 12 may be silicon on insulator, or silicon on sapphire, et cetera. Substrate 12 is preferably thermally oxidized to form first buffer layer 14, which may have a thickness ranging from 5 to 100 nanometers. Alternatively, first buffer layer 14 may be chemical vapor deposited silicon dioxide. Following the formation of first buffer layer 14, oxidation resistant layer 16 is formed overlying first buffer layer 14. Oxidation resistant layer 16 is preferably chemical vapor deposited silicon nitride and may have a thickness ranging from 50 to 300 nanometers. Alternatively, oxidation resistant layer 16 may also be another material such as oxynitride.

Figure 2:
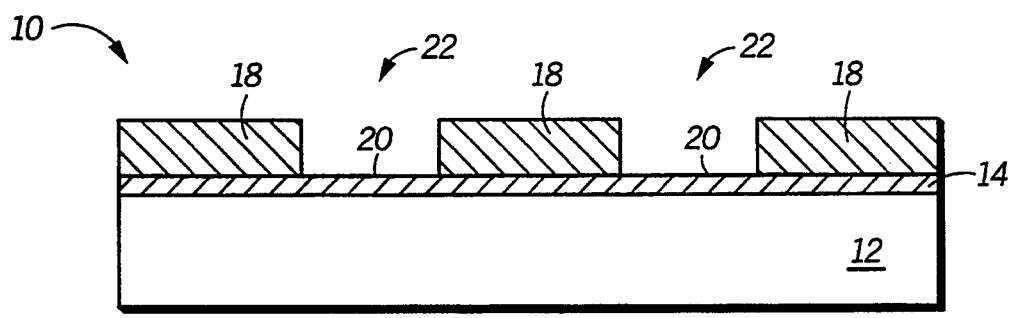

In FIG. 2, using conventional photolithographic patterning and etching techniques, oxidation resistant layer 16 is then patterned to leave a remaining portion 18, of oxidation resistant layer 16, overlying substrate 12. The patterning process also exposes a portion 20 of buffer layer 14 and defines an isolation region 22 of substrate 12. Additionally, after the patterning process, isolation region 22 may be doped using a diffusion or implantation step.

Figure 3:
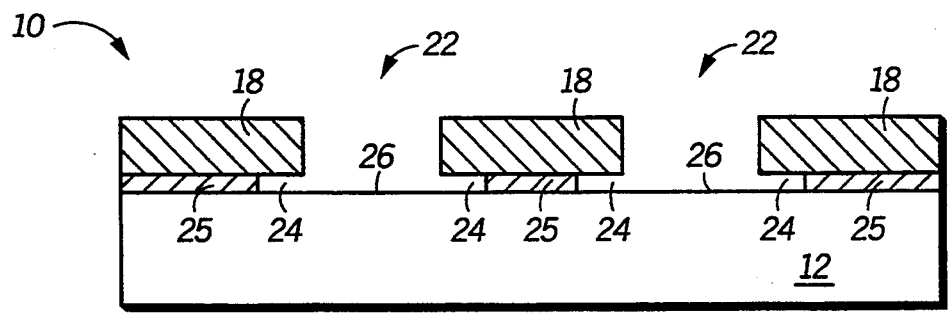

In FIG. 3, exposed portion 20 of buffer layer 14 is then selectively and isotropically etched to form a recess 24 under an edge portion of remaining portion 18. The etching process also leaves a remaining portion 25 of buffer layer 14 overlying substrate 12, and in addition forms an exposed portion 26 of substrate 12. A wet etchant such as hydrofluoric acid is preferably used to etch exposed portion 20, and thus form recess 24. Alternatively, exposed portion 20 may also be etched using other conventional isotropic etching techniques such as vapor etching or chemical downstream plasma etching.

Figure 4:
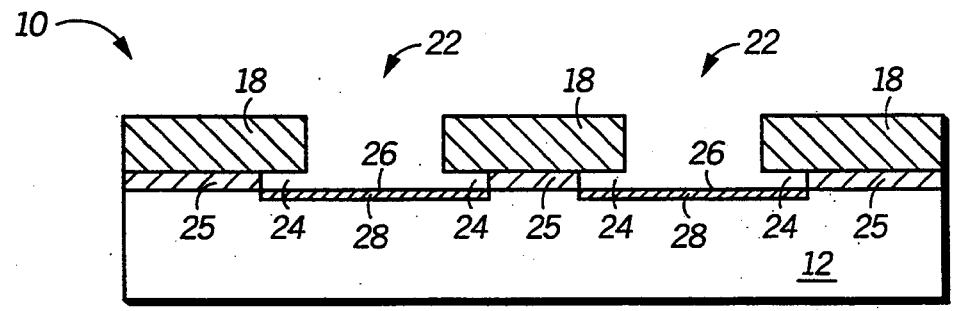

The process continues in FIG. 4 with the formation of a second buffer layer 28 overlying exposed portion 26 of substrate 12. Buffer layer 28 is preferably a silicon dioxide layer having a thickness of less than 25 nanometers, which is formed by thermally reoxidizing exposed portion 26.

Figure 5:
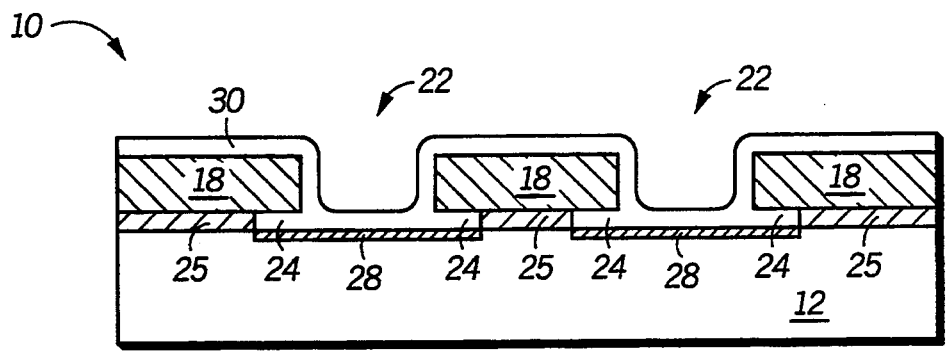

In FIG. 5, a silicon-germanium layer 30 is then formed overlying remaining portion 18 and second buffer layer 28, and substantially filling recess 24. Silicon-germanium layer 30 is preferably formed by low pressure chemical vapor deposition using silane and germanium tetrahydride at a deposition temperature of approximately 500 to 675 degrees centigrade. Silicon-germanium layer 30 may have a thickness ranging from 10 to 100 nanometers and preferably has a stoichiometry of $Si_xGe_{1-x}$ wherein x lies within the following range $0.1 < x < 0.6$.

Figure 6:
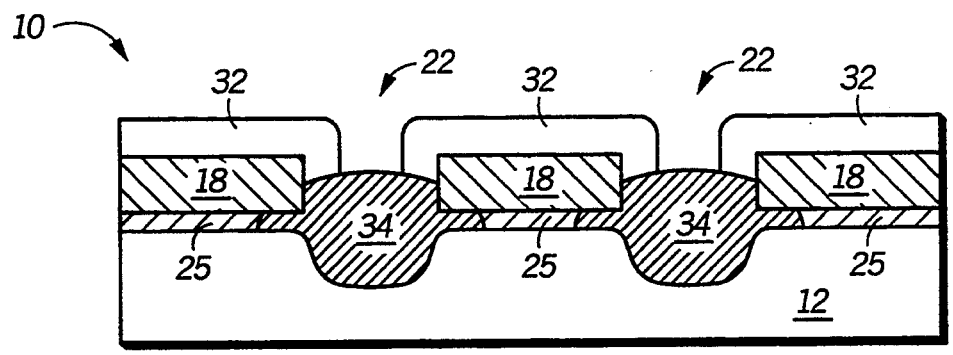

In FIG. 6, a thermal oxidation is performed to grow a thick electrical isolation oxide 34 within isolation region 22 of substrate 12. During the oxidation process, silicon-germanium layer 30 is oxidized to form an oxidized layer 32. The oxidation process is preferably carried out in a furnace at about 900 to 1200 degrees Celsius in the presence of nitrogen and steam. Alternatively, electrical oxidation oxide 34 may also be formed using high pressure oxidation.

Figure 7:
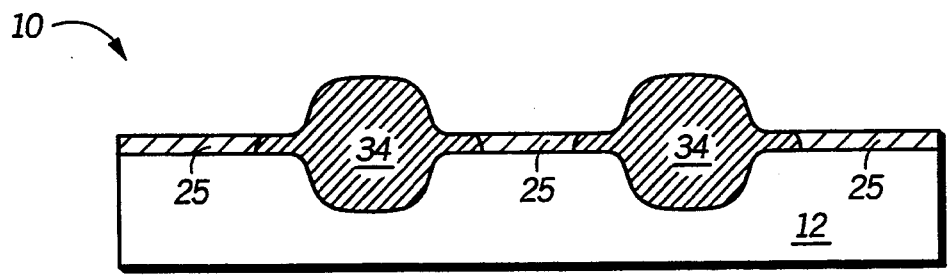

In FIG. 7, portions of oxidized layer 32, that overlie remaining portion 18, are then removed with hydrofluoric acid, and then remaining portion 18 is removed with phosphoric acid.

Figure 8:
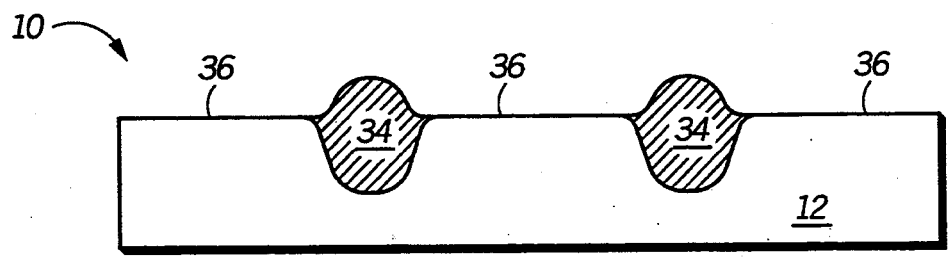

In FIG. 8, a silicon-germanium etchant is then applied to the substrate in order to selectively remove any unoxidized silicon-germanium that may be left in regions associated with the recess. Any residual silicon-germanium may be removed in a (35:20:10) mixture of nitric acid: water: hydrofluoric acid (0.5%), with a selectivity to single crystal silicon of up to 100 to 1. Other mixtures of this etchant, however, as well as other well-known silicon-germanium wet etchants that have a high etch selectivity to single crystal silicon could also be used. For example, mixtures of hydrofluoric acid:water:hydrogen peroxide, or mixtures of hydrofluoric acid:hydrogen peroxide:acetic acid such as (1:2:3), or mixtures of ammonium hydroxide:hydrogen peroxide:water could also be used. Remaining portion 25 is then removed with hydrofluoric acid. Semiconductor devices can then be formed in active regions 36 separated by isolation oxide 34.

Figure 9:
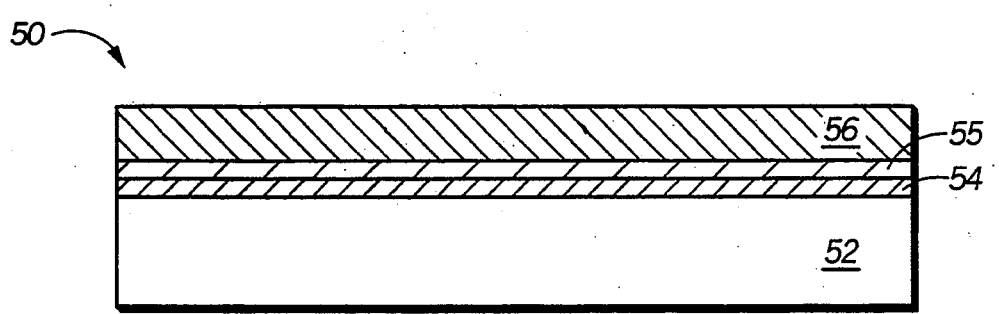
FIGS. 9–13 illustrate, in cross-section, process steps in accordance with another embodiment of the invention.

FIGS. 9 through 13 illustrate, in cross-section, process steps in accordance with another embodiment of the invention wherein electrical isolation structures are formed in an integrated circuit. Shown in FIG. 9 is a portion 50 of an integrated circuit structure comprising a semiconductor substrate 52, a buffer layer 54, a silicon-germanium layer 55, and an oxidation resistant layer 56. Substrate 52 is preferably monocrystalline silicon. Alternatively substrate 52 may be silicon on insulator, or silicon on sapphire, et cetera. Substrate 52 is preferably thermally oxidized to form buffer layer 54, which may have a thickness ranging from 5 to 100 nanometers. Alternatively, buffer layer 54 may be chemical vapor deposited silicon dioxide. Following the formation of buffer layer 54, silicon-germanium layer 55 is formed overlying buffer layer 54. Silicon-germanium layer 55 is preferably formed by low pressure chemical vapor deposition using silane and germanium tetrahydride at a deposition temperature of approximately 500 to 675 degrees centigrade. Silicon-germanium layer 55 may have a thickness ranging from 10 to 100 nanometers and preferably has a stoichiometry of $Si_xGe_{1-x}$ wherein x lies within the following range $0.1 < x < 0.6$. Oxidation resistant layer 56 is then formed overlying silicon-germanium layer 55. Oxidation resistant layer 56 is preferably chemical vapor deposited silicon nitride and may have a thickness ranging from 50 to 300 nanometers. Alternatively, oxidation resistant layer 56 may also be another material such as oxynitride.

Figure 10:
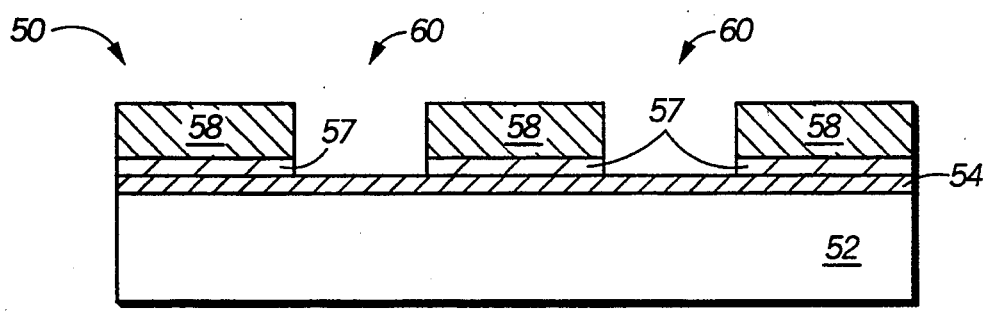

In FIG. 10, using conventional photolithographic patterning techniques a masking layer was then formed over a portion of the oxidation resistant layer. Exposed portions of oxidation resistant layer 56 and underlying portions of silicon-germanium layer 55 are then patterned using a dry etch process. The patterning process leaves a remaining portion 58, of oxidation resistant layer 56, and a remaining portion 57, of silicon-germanium layer 55, overlying substrate 52. The patterning process also defines an isolation region 60 of substrate 52. Additionally, after the patterning process, isolation region 60 may be doped using a diffusion or implantation step. An Applied Material's 8110 batch etch system having the following operating parameters was used to etch oxidation resistant layer 56 and silicon-germanium layer 55; a pressure of approximately 20 millitorr, a forward power of approximately 800 watts, a DC bias of approximately $-450$ volts, an oxygen flow rate of approximately 10 sccm, and a flow rate of Freon 23 of approximately 80 sccm. It should be well known, however, that other conventional etch chemistries and etch systems could also be used for the patterning process.

Figure 11:
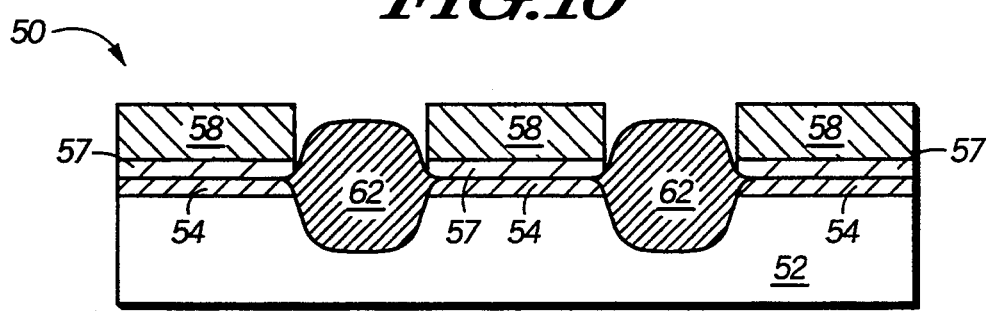

In FIG. 11, a thermal oxidation is then performed to grow a thick electrical isolation oxide 62 within isolation region 60 of substrate 52. The oxidation process is preferably carried out in a furnace at about 900 to 1200 degrees Celsius in the presence of nitrogen and steam. Alternatively, electrical oxidation oxide 62 may also be formed using high pressure oxidation.

Figure 12:
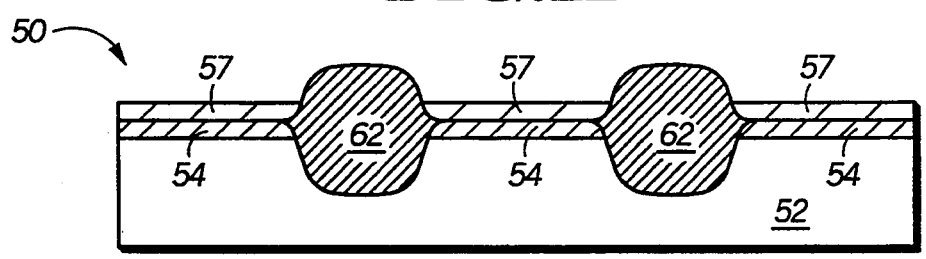

In FIG. 12, remaining portion 58, of oxidation resistant layer 56, is exposed to hydrofluoric acid and then removed with phosphoric acid.

Figure 13:
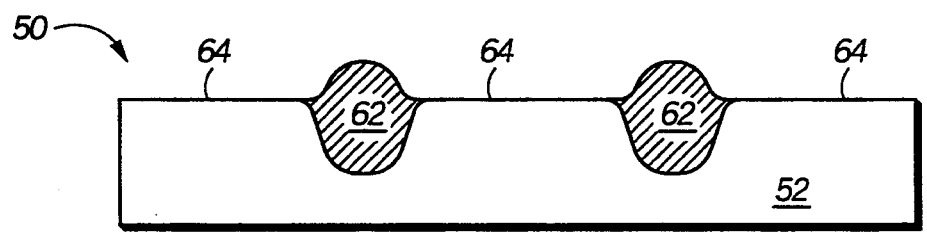

In FIG. 13, a silicon-germanium etchant is then applied to the substrate in order to selectively remove remaining portion 57 of silicon-germanium layer 55. Remaining portion 57 may be removed by a (35:20:10) mixture of nitric acid: water: hydrofluoric acid (0.5%), with a selectivity to single crystal silicon of up to 100 to 1. Other mixtures of this etchant, however, as well as other well-known silicon-germanium wet etchants that have a high etch selectivity to single crystal silicon could also be used. For example, mixtures of hydrofluoric acid:water:hydrogen peroxide, or mixtures of hydrofluoric acid:hydrogen peroxide:acetic acid such as (1:2:3), or mixtures of ammonium hydroxide:hydrogen peroxide:water could also be used. The remaining portion of buffer 54 is then removed with hydrofluoric acid. Semiconductor devices can then be formed in active regions 64 separated by isolation oxide 62.

The foregoing description and illustrations contained herein demonstrate many of the advantages associated with the present invention. One advantage is that a silicon-germanium layer allows buffer oxides with reduced thickness to be used LOCOS like isolation schemes. Therefore, oxidation of the silicon surface, underlying the edge portion of the oxidation mask, is minimized and as a result, field oxide encroachment into the active regions is reduced. This in turn allows integrated circuit devices with higher packing densities to be fabricated. In addition, the silicon-germanium layer can be selectively removed with respect to the underlying silicon substrate. Therefore, pinholes or defects in a buffer oxide layer, which is overlying the silicon substrate, will not result in the substrate being damaged when the silicon-germanium layer is removed. Additionally, because the substrate in the active area is not damaged, the reliability and functionality of semiconductor devices subsequently built on these active regions is improved.

Thus it is apparent that there has been provided, in accordance with the invention, a method for forming electrical isolation in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, although it is not shown in FIG. 2, buffer layer 20 may also be etched during the patterning process. Similarly, although it is not shown in FIG. 10, buffer layer 54 may also be etched during the patterning process. Moreover, it should be known that silicon-germanium layer 55 need not be patterned, as shown in FIG. 10. Alternatively, oxidation resistant layer 56 may be patterned to define isolation region 60 such that the etch process stops on, or slightly within, silicon-germanium layer 55. Isolation region 60 would then be oxidized to form electrical isolation oxide 62, as previously described. Therefore, it is intended that this invention encompass all such variations and modifications as fall within the scope of the appended claims.

We claim:

1. A method for forming electrical isolation in an integrated circuit device comprising the steps of:
    providing a semiconductor substrate;
    forming a buffer layer overlying the substrate;
    forming a silicon-germanium layer overlying the buffer layer;
    forming an oxidation resistant layer overlying the silicon-germanium layer;
    patterning the oxidation resistant layer to define an isolation region of the substrate, and to leave a remaining portion of the oxidation resistant layer overlying the substrate;
    oxidizing the isolation region of the substrate to form electrical isolation in the isolation region of the substrate;
    removing the remaining portion of the oxidation resistant layer; and
    applying a silicon-germanium etchant to the substrate.

2. The method of claim 1 wherein the step of applying the silicon-germanium etchant is further characterized as applying a wet etchant comprising hydrofluoric acid and hydrogen peroxide.

3. The method of claim 1 wherein the step of applying the silicon-germanium etchant is further characterized as applying a wet etchant comprising hydrofluoric acid and nitric acid.

4. The method of claim 1 wherein the step of applying the silicon-germanium etchant is further characterized as applying a wet etchant comprising ammonium hydroxide and hydrogen peroxide.

5. A method for forming electrical isolation in an integrated circuit device comprising the steps of:
    providing a substrate;
    forming a first buffer layer overlying the substrate;
    forming an oxidation resistant layer overlying the first buffer layer;
    patterning the oxidation resistant layer to form an exposed portion of the first buffer layer, and to leave a remaining portion of the oxidation resistant layer overlying the substrate, and to define an isolation region of the substrate;
    etching the exposed portion of the first buffer layer to form a recess under an edge portion of the remaining portion of the oxidation resistant layer, and to form an exposed portion of the substrate, and to leave a remaining portion of the buffer layer overlying the substrate;
    forming a second buffer layer overlying the exposed portion of the substrate;
    forming a silicon-germanium layer overlying the remaining portion of the oxidation resistant layer and the second buffer layer wherein the silicon-germanium layer substantially fills the recess;
    oxidizing the isolation region of the substrate to form electrical isolation in the isolation region of the substrate;
    removing the remaining portion of the oxidation resistant layer; and
    applying a silicon-germanium etchant to the substrate.

6. The method of claim 5 wherein the step of applying the silicon-germanium etchant is further characterized as applying a wet etchant comprising hydrofluoric acid and hydrogen peroxide.

7. The method of claim 5 wherein the step of applying the silicon-germanium etchant is further characterized as applying a wet etchant comprising hydrofluoric acid and nitric acid.

8. The method of claim 5 wherein the step of applying the silicon-germanium etchant is further characterized as applying a wet etchant comprising ammonium hydroxide and hydrogen peroxide.

* * * * *